US011019746B1

(12) United States Patent
Balekundri et al.

(10) Patent No.: US 11,019,746 B1
(45) Date of Patent: May 25, 2021

(54) LATERAL ALIGNMENT SYSTEM FOR AN APPLIANCE CONTROL PANEL ASSEMBLY AND METHOD

(71) Applicant: WHIRLPOOL CORPORATION, Benton Harbor, MI (US)

(72) Inventors: Abubackar M. Balekundri, Belgaum (IN); Shamraiz Nazmi, Pune (IN)

(73) Assignee: Whirlpool Corporation, Benton Harbor, MI (US)

( * ) Notice: Subject to any disclaimer, the term of this patent is extended or adjusted under 35 U.S.C. 154(b) by 0 days.

(21) Appl. No.: 16/812,453

(22) Filed: Mar. 9, 2020

(51) Int. Cl.
H05K 7/14 (2006.01)
H05K 5/00 (2006.01)
H05K 5/02 (2006.01)

(52) U.S. Cl.
CPC ............. *H05K 7/14* (2013.01); *H05K 5/0017* (2013.01); *H05K 5/0217* (2013.01)

(58) Field of Classification Search
CPC . F24C 7/082; F24C 3/124; F24C 5/16; H05K 7/14; H05K 5/0017; H05K 5/0217
See application file for complete search history.

(56) References Cited

U.S. PATENT DOCUMENTS

| | | | | |
|---|---|---|---|---|
| 4,894,493 A | | 1/1990 | Smith et al. | |
| 5,611,610 A | * | 3/1997 | Katz | D06F 39/12 |
| | | | | 312/263 |
| 5,685,623 A | * | 11/1997 | Katz | D06F 39/12 |
| | | | | 312/263 |
| 5,738,424 A | * | 4/1998 | Katz | D06F 39/12 |
| | | | | 312/223.1 |
| 5,971,510 A | | 10/1999 | Lickiss et al. | |
| 6,065,820 A | * | 5/2000 | Fleissner | F24C 7/082 |
| | | | | 312/236 |
| 6,371,583 B1 | | 4/2002 | Visin | |
| 8,106,325 B2 | | 1/2012 | Laurent et al. | |
| 9,220,394 B2 | * | 12/2015 | Heater | D06F 34/28 |
| 9,513,013 B2 | | 12/2016 | May et al. | |
| 2014/0049926 A1 | * | 2/2014 | Bas | H05K 1/00 |
| | | | | 361/759 |
| 2016/0370013 A1 | * | 12/2016 | Kozinski | F24C 7/086 |
| 2018/0094819 A1 | * | 4/2018 | Heo | F24C 7/082 |
| 2018/0274790 A1 | * | 9/2018 | Kim | F24C 3/124 |
| 2020/0183466 A1 | * | 6/2020 | Chen | G06F 1/187 |
| 2020/0271326 A1 | * | 8/2020 | Kozinski | F24C 3/124 |
| 2021/0010676 A1 | * | 1/2021 | Davison | F24C 3/122 |

FOREIGN PATENT DOCUMENTS

DE 102011079229 A1 1/2013

* cited by examiner

*Primary Examiner* — Daniel J Rohrhoff
(74) *Attorney, Agent, or Firm* — Price Heneveld LLP (57) ABSTRACT

An appliance includes a control panel assembly having a rearwardly extending mounting member. The rearwardly extending mounting member includes a body portion having an outer edge with one or more slots disposed through the body portion and inwardly opening from the outer edge of the body portion. A housing includes a support bracket having a support surface with one or more mounting apertures disposed therethrough. One or more locating pins are received through the one or more mounting apertures. The locating pins include body portions upwardly extending from the support surface of the support bracket. The one or more locating pins are removably received in the one or more slots of the rearwardly extending mounting member of the control panel assembly.

19 Claims, 6 Drawing Sheets

LATERAL ALIGNMENT SYSTEM FOR AN APPLIANCE CONTROL PANEL ASSEMBLY AND METHOD

BACKGROUND OF THE DISCLOSURE

The present disclosure generally relates to an alignment system for an appliance, and more specifically, to an alignment system that centers a console on an appliance.

SUMMARY OF THE DISCLOSURE

According to one aspect of the present disclosure, an appliance includes a control panel assembly having a rearwardly extending mounting member. The rearwardly extending mounting member includes a body portion having an outer edge with one or more slots disposed through the body portion and inwardly opening from the outer edge of the body portion. A housing includes a support bracket having a support surface with one or more mounting apertures disposed therethrough. One or more locating pins are received through the one or more mounting apertures. The locating pins include body portions upwardly extending from the support surface of the support bracket. The one or more locating pins are removably received in the one or more slots of the rearwardly extending mounting member of the control panel assembly.

According to another aspect of the present disclosure, an appliance includes a housing with a frame assembly having a support bracket. The support bracket includes at least one locating pin. A mounting plate includes a front surface with a mounting member outwardly extending from the front surface of the mounting plate. The mounting member includes at least one slot through which the at least one locating pin is slidably received.

According to yet another aspect of the present disclosure, a method of mounting a control panel assembly to an appliance comprises the steps of: (1) providing a control panel assembly having a mounting member with at least one slot (2) providing a housing with a support bracket having at least one locating pin upwardly extending therefrom (3) positioning the control panel assembly in a centered position on the support plate by positioning the at least one locating pin of the housing in the at least one slot of the control panel assembly (4) retaining the control panel assembly in the centered position on the support plate by operably coupling reciprocal mounting features disposed on the housing and the control panel assembly to one another after the control panel assembly is positioned in the centered position.

These and other features, advantages, and objects of the present disclosure will be further understood and appreciated by those skilled in the art by reference to the following specification, claims, and appended drawings.

The components in the figures are not necessarily to scale, emphasis instead being placed upon illustrating the principles described herein.

DETAILED DESCRIPTION

The present illustrated embodiments reside primarily in combinations of method steps and apparatus components related to an alignment system for a console of an appliance. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

Figure 1:
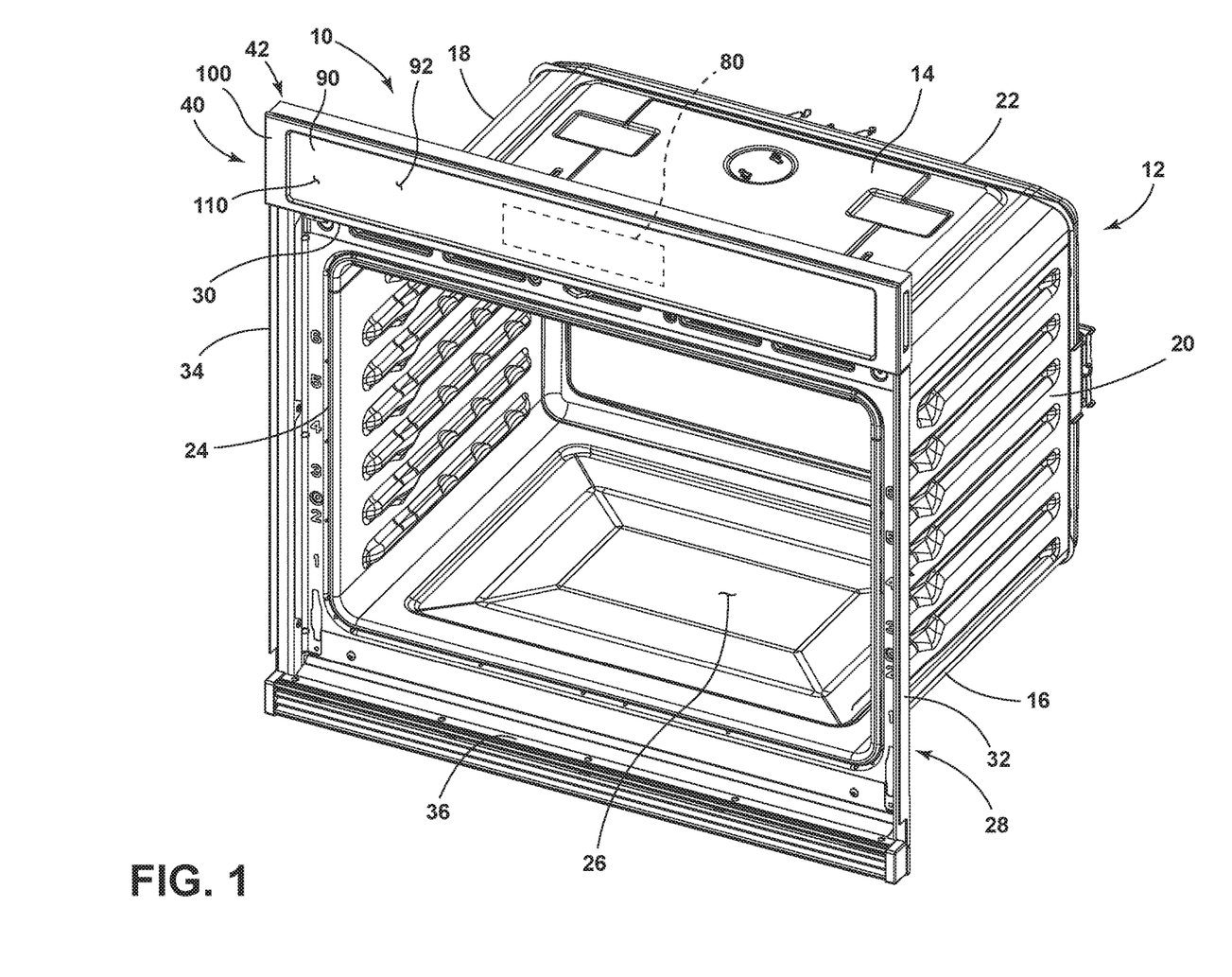
FIG. 1 is a front top perspective view of an appliance having a control panel assembly centered over a cooking cavity.

For purposes of description herein, the terms "upper," "lower," "right," "left," "rear," "front," "vertical," "horizontal," and derivatives thereof shall relate to the disclosure as oriented in FIG. 1. Unless stated otherwise, the term "front" shall refer to the surface of the element closer to an intended viewer, and the term "rear" shall refer to the surface of the element further from the intended viewer. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a . . . " does not, without more constraints, preclude the existence of additional identical elements in the process, method, article, or apparatus that comprises the element.

Referring to FIG. 1, reference numeral 10 generally designates an appliance, shown in the form of a built-in oven, but may also include a range having an oven portion, a microwave oven, a toaster oven, a refrigerator or a laundry care appliance, such as a front loading washer or dryer. The appliance 10 includes a housing 12 having upper and lower sides 14, 16 which are interconnected by first and second sidewalls 18, 20. The housing 12 further includes a rear panel 22 and an open front portion 24. The open front portion 24 opens into a cooking cavity 26 generally defined by the upper and lower sides 14, 16 and the first and second sidewalls 18, 20 of the housing 12. The housing 12 further includes a frame assembly 28 disposed around the open front portion 24 of the housing 12. The frame assembly 28 includes a support bracket 30, best shown in FIG. 3 that is positioned above the cooking cavity 26. The support bracket 30 is interconnected at opposite sides thereof by first and second side members 32, 34 of the frame assembly 28. The frame assembly 28 is shown in FIG. 1 as a front frame assembly, and may also include a lower bracket 36 interconnecting the first and second side members 32, 34.

As further shown in FIG. 1, the appliance 10 includes a control panel assembly 40 that is mounted to the housing 12. Specifically, the control panel assembly 40 is supported on the support bracket 30 of the frame assembly 28 in a centered position, as further described below. In this way, the control panel assembly 40 is mounted above the cooking cavity 26 in a centered position on the housing 12, as shown in FIG. 1. The control panel assembly 40 is mounted on a front portion of the housing 12, such that the control panel assembly 40 is easily accessible to a user of the appliance 10. The control panel assembly 40 defines a user interface console for the appliance 10, such that a user may control the features of the appliance 10 through the control panel assembly 40, as further described below. The control panel assembly 40 may be referred to herein as a console or console assembly. The control panel assembly 40 includes a mounting plate 42 with a trim member 100 mounted on the mounting plate 42. A pane 90 is further mounted to the mounting plate 42 and includes a user interface 80 mounted thereto. Both the control panel assembly 40 and the user interface 80 are centered on the housing 12 and centered over the cooking cavity 26 of the appliance 10.

Figure 2:
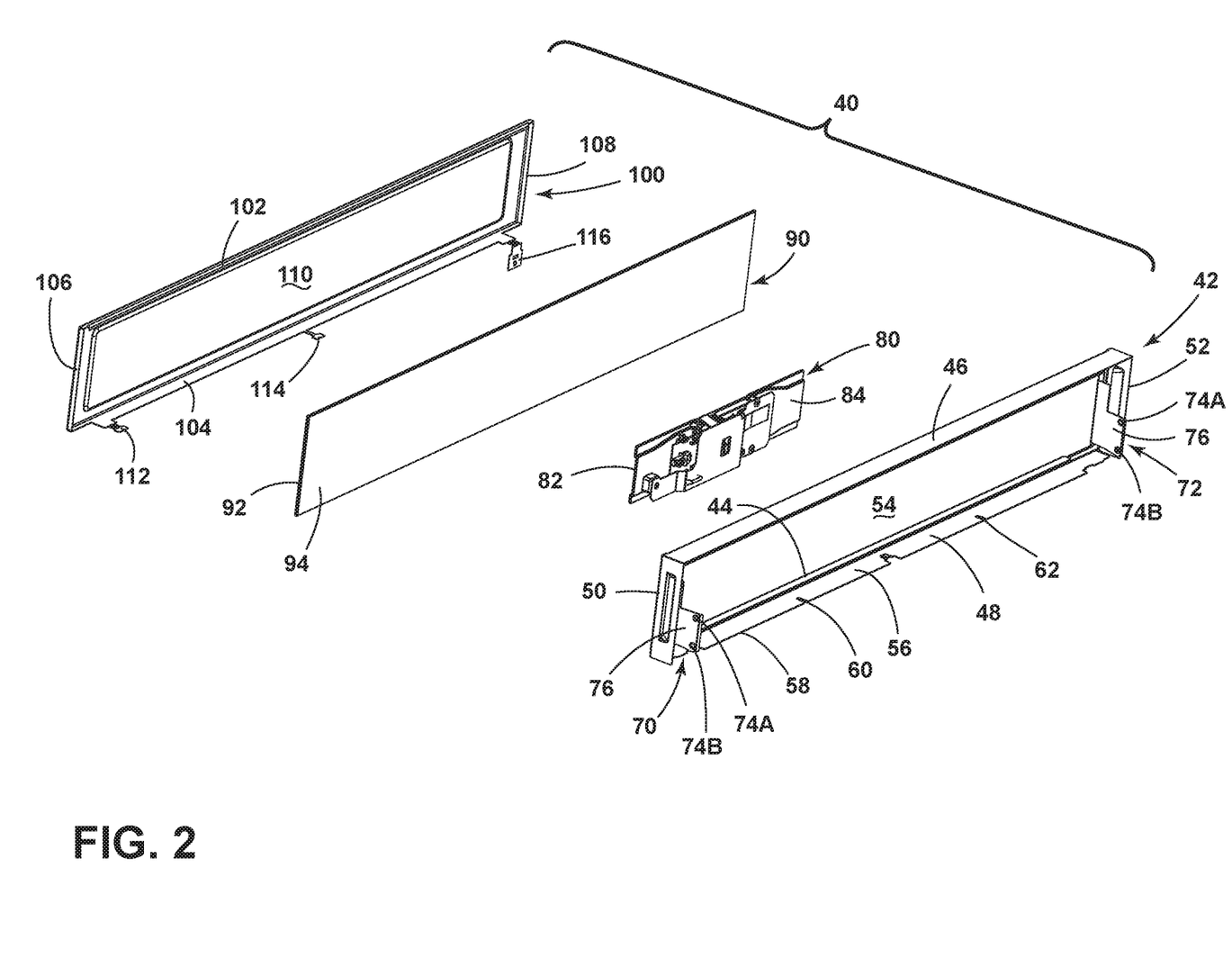
FIG. 2 is an exploded rear top perspective view of the control panel assembly of FIG. 1.

Referring now to FIG. 2, the mounting plate 42 of the control panel assembly 40 includes a front surface 44. The mounting plate 42 further includes an upper member 46 spaced-apart from a mounting member 48 and interconnected by first and second side portions 50, 52. Together, the upper member 46, the mounting member 48 and the first and second side portions 50, 52 cooperate to surround and define a window 54 that is generally centrally disposed on the mounting plate 42. The mounting member 48 outwardly extends from the front surface 44 of the mounting plate 42 in a rearward direction. The mounting member 48 includes a body portion 56 having an outer edge 58. First and second slots 60, 62 are disposed through the body portion 56 and open inwardly from the outer edge 58 of the body portion 56. The first and second slots 60, 62 are contemplated to be similar or identical in configuration, such that like reference numerals are used to describe common features of both the first and second slots 60, 62. In this way, the first and second slots 60, 62 open inwardly from the outer edge 58 into the body portion 56 at open front portion 64 (FIGS. 3 and 5) of the first and second slots 60, 62, and are directed towards the front surface 44 of the mounting plate 42 from the outer edge 58 of the body portion 56 towards the closed end portions 66 (FIGS. 3 and 5) of the first and second slots 60, 62. As such, the mounting member 48 is a rearwardly extending mounting member having the first and second slots 60, 62 that are used to help align the control panel assembly 40 on the housing 12 of the appliance 10, as further described below. In the embodiment shown in FIG. 2, the mounting member 48 includes the first and second slots 60, 62, but may include more slots disposed through the body portion 56 thereof. It is also contemplated that a single slot may be disposed on the mounting member 48, without departing from the spirit of the present concept.

As further shown in FIG. 2, the mounting plate 42 includes first and second mounting brackets 70, 72 which each include upper and lower mounting apertures 74A, 74B disposed through associated body portions 76 thereof. The first and second mounting brackets 70, 72 are disposed on opposed sides of the mounting plate 42, such that the first and second mounting brackets 70, 72 are spaced-apart from one another and outwardly extend from the front surface 44 of the mounting plate 42 in a rearward direction. Specifically, the first and second mounting brackets 70, 72 are disposed on opposed first and second sides 40A, 40B of the control panel assembly 40, and rearwardly extend from the control panel assembly 40, as shown in the assembled condition in FIG. 3. As shown in the embodiment of FIG. 2, the first and second mounting brackets 70, 72 are disposed above the mounting member 48 on the mounting plate 42. It is contemplated that the first and second mounting brackets 70, 72 as well as the mounting plate 42 may include portions of a sheet metal substrate that remain after the window 54 is stamped into the mounting plate 42. After stamping the window 54, the portions of the sheet metal material can be bent rearwardly to define the first and second mounting bracket 70, 72 as well as the mounting member 48.

As further shown in FIG. 2, the user interface 80 of the control panel assembly 40 includes first and second sides 82, 84. The user interface 80 may include activation buttons, a display screen, a controller, and any other component parts necessary for a user to control the features of the appliance via the user interface 80. Thus, the user interface 80 is contemplated to be electronically coupled to a controller for controlling aspects of the appliance 10. With the appliance 10 shown in the form of an oven in FIG. 1, it is contemplated that the user interface 80 will include programming interface options for controlling aspects of the cooking cavity 26 and any heating element or heating features configured to heat the cooking cavity 26. The user interface 80 may include a digital interface that uses a touchscreen graphical user interface, or may include physical buttons and switches for controlling the appliance 10.

Figure 3:
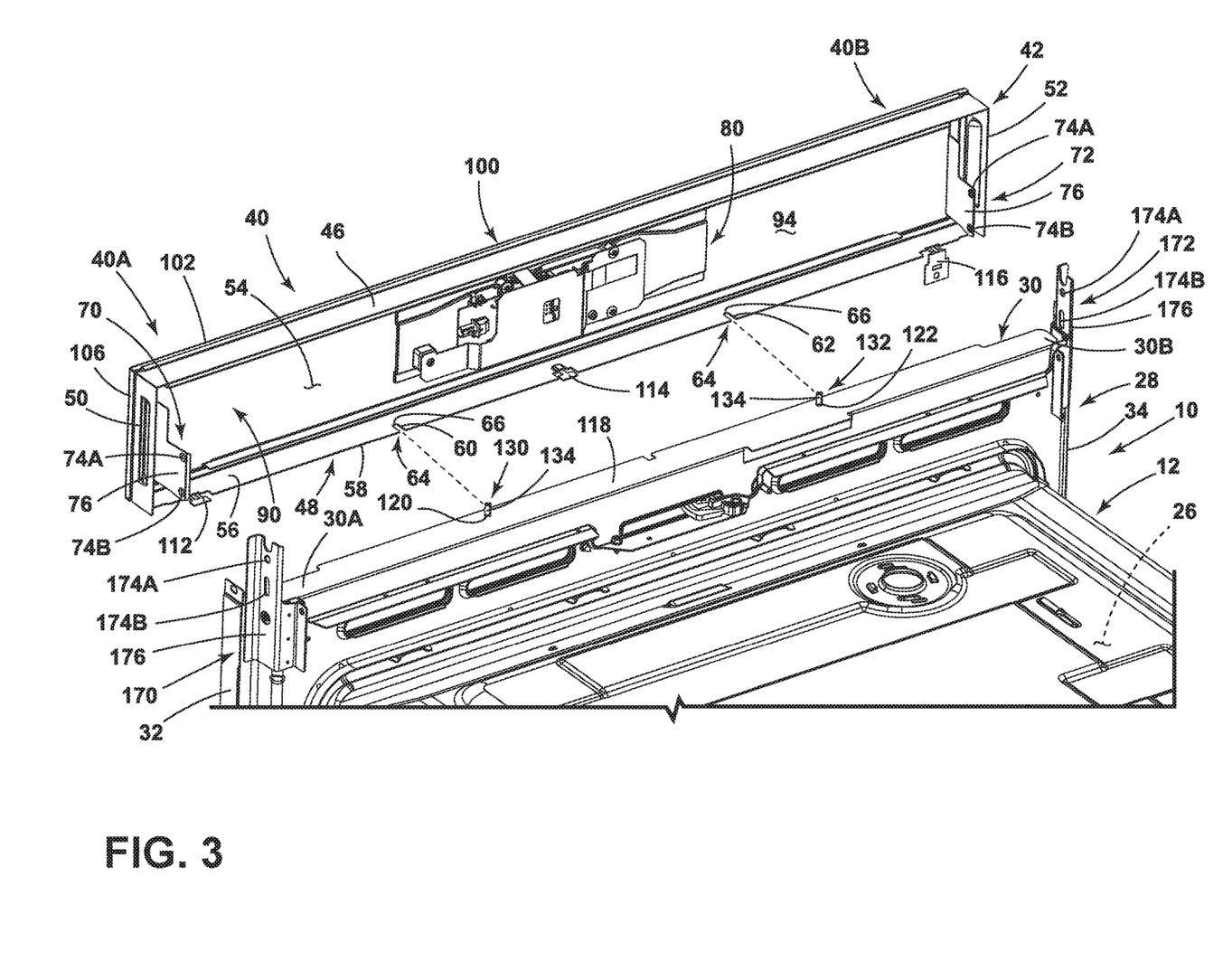
FIG. 3 is a rear top perspective view of the appliance and control panel assembly of FIG. 1 with the control panel assembly exploded away from the appliance.
Figure 4:
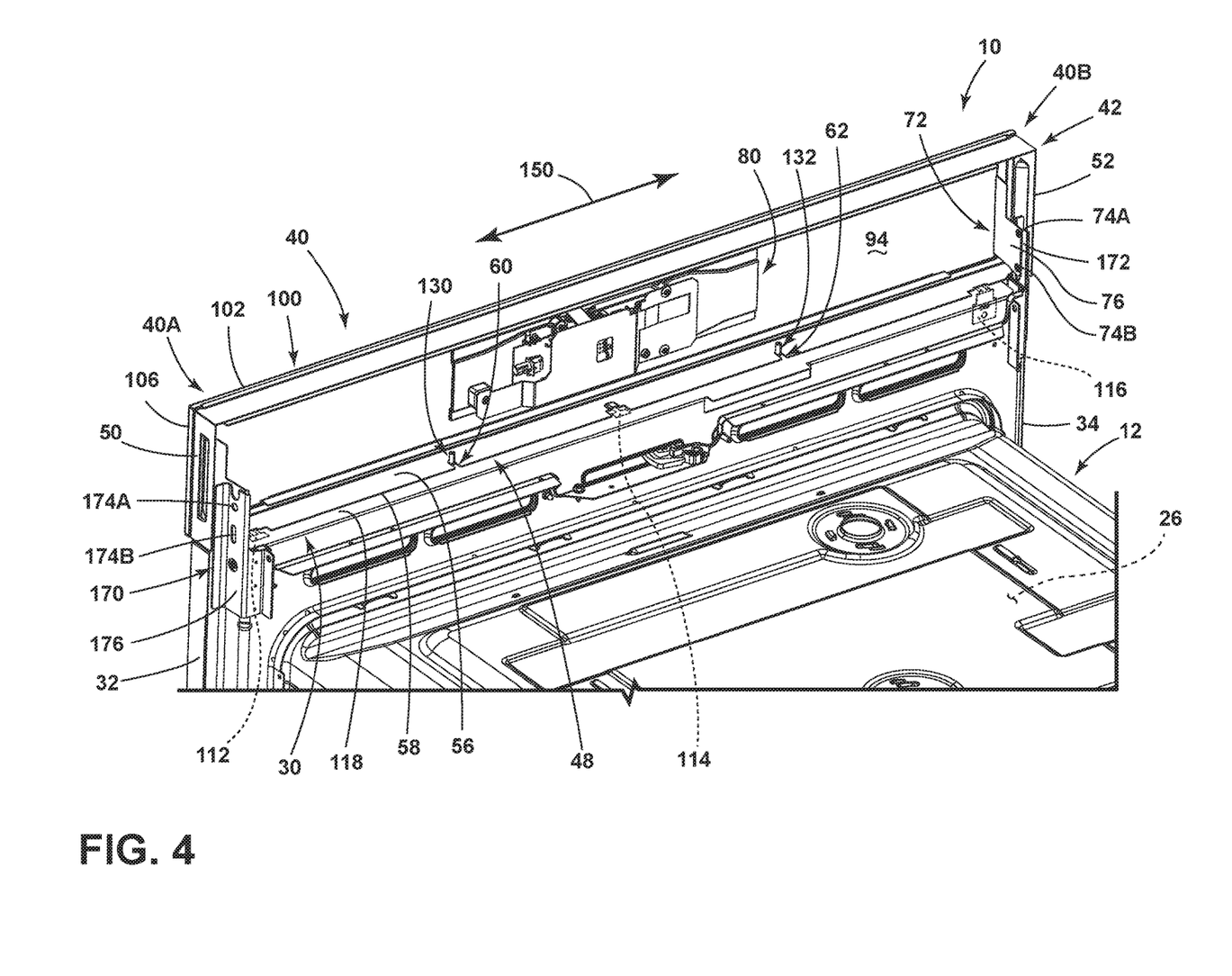
FIG. 4 is a rear top perspective view of the appliance and control panel assembly of FIG. 3 as assembled.

As further shown in FIG. 2, the pane 90 of the control panel assembly 40 includes first and second surfaces 92, 94. The pane 90 may be a glass pane or acrylic pane, through which the user interface 80 can be controlled. In this way, the pane 90 may include a conductive touchscreen material that allows a user to operate the user interface 80. In assembly, the user interface 80 is mounted to the second surface 94 of the pane 90 at the first side 82 of the user interface 80. The pane 90 is contemplated to be mounted to the mounting plate 42 at the front surface 44 of the mounting plate 42 at the second surface 94 of the pane 90. The user interface 80 is contemplated to be centered on the second surface 94 of the pane 90, such that the user interface 80 can be centered on the control panel assembly 40 in assembly, as best shown in FIGS. 3 and 4. Other positions for the user interface 80 are also contemplated on the control panel assembly 40. Thus, the user interface 80 is mounted to the mounting plate 42 through the pane 90.

As further shown in FIG. 2, the control panel assembly 40 includes a trim member 100 having upper and lower members 102, 104 that are interconnected by first and second side members 106, 108. In assembly, the upper and lower members 102, 104 and the first and second side members 106, 108 cooperate to define a window 110 that is generally centrally disposed on the trim member 100. The trim member 100 is contemplated to be mounted to the first surface 92 of the pane 90, and is further contemplated to be mounted to the mounting plate 42. The trim member 100 may further be mounted to the housing 12 of the appliance 10 using mounting features 112, 114 and 116 extending outwardly from the lower member 104. With reference to FIG. 1, the pane 90 is shown positioned within the window 110 defined by the trim member 100.

Referring now to FIG. 3, the control panel assembly 40 is shown in an assembled condition and exploded away from the housing 12 of the appliance 10. In FIG. 3, the support bracket 30 of the frame assembly 28 of the housing 12 includes a support surface 118 which defines an upper surface of the support bracket 30. The support bracket 30 further includes first and second mounting apertures 120, 122 disposed therethrough. The first and second locating pins 130, 132 are received through the first and second mounting apertures 120, 122 of the support bracket 30, such that the first and second locating pins 130, 132 upwardly extend from the support surface 118 of the support bracket 30. The first and second locating pins 130, 132 are contemplated to be similar or identical in configuration, such that like reference numerals are used to describe common features of both the first and second locating pins 130, 132. The locating pins 130, 132 each include body portions 134 that upwardly extend from the support surface 118 of the support bracket 30. In assembly, the first and second locating pins 130, 132 are configured to be horizontally received within the first and second slots 60, 62, respectively, when the control panel assembly 40 is mounted on the housing 12 at the support bracket 30. In FIG. 3, dashed lines are used to indicate the horizontal reception of the locating pins 130, 132 to the first and second slots 60, 62. Said differently, the first and second slots 60, 62 are configured to horizontally receive the first and second locating pins 130, 132, respectively, in the mounting of the control panel assembly 40 to the housing 12 of the appliance 10. Thus, the first and second slots 60, 62 are contemplated to be spaced-apart a distance that correlates to a spacing provided between the first and second locating pins 130, 132, for the associated engagement of the same when mounting the control panel assembly 40 to the support bracket 30.

As further shown in FIG. 3, the housing 12 of the appliance 10 further includes first and second mounting features 170, 172. The first and second mounting features 170, 172 are contemplated to be similar or identical in configuration, such that like reference numerals are used to describe common features shared between the first and second mounting features 170, 172. As shown in FIG. 3, the first and second mounting features 170, 172 include body portions 176 which upwardly extend from opposed first and second sides 30A, 30B of the support bracket 30. The body portions 176 may be mounted to the frame assembly 28 at the first and second side members 32, 34, respectively, of the frame assembly 28. The first and second mounting features 170, 172 each include an upper mounting aperture 174A disposed above a lower mounting slot 174B. In assembly, the upper mounting apertures 174A of the first and second mounting features 170, 172 of the housing 12 are configured to align with the upper mounting apertures 74A of the first and second mounting brackets 70, 72, respectively. Similarly, the lower mounting slots 174B of the first and second mounting features 170, 172 of the housing 12 are configured to align with the lower mounting apertures 74B of the first and second mounting brackets 70, 72, respectively. In this way, the control panel assembly 40 can be fixedly coupled to the housing 12 after being centered on the support bracket 30 by the engagement of the first and second locating pins 130, 132 with the first and second slots 60, 62, respectively, of the control panel assembly 40. It is contemplated that the interconnection between the first and second mounting brackets 70, 72 and the first and second mounting features 170, 172 is provided using fasteners received through the respective mounting apertures 74A, 74B, 174A and mounting slots 174B thereof. The lower mounting slots 174B of the first and second mounting features 170, 172 are oblong-shaped apertures which can accommodate variations in control panel and appliance components to provide for specific and consistent spacing between edges of the control panel assembly 40 and adjacent edges of the housing 12, or components thereof (such as an appliance door).

Referring now to FIG. 4, the control panel assembly 40 is shown mounted to the housing 12 at the support bracket 30 thereof. Specifically, the first and second locating pins 130, 132 are shown received within the first and second slots 60, 62. The first and second locating pins 130, 132 are specifically positioned on the support bracket 30, and the first and second slots 60, 62 are specifically positioned on the mounting member 48 of the mounting plate 42, such that when the first and second locating pins 130, 132 are horizontally received within the first and second slots 60, 62, the control panel assembly 40 is centered on the housing 12 of the appliance 10. As further shown in FIG. 4, the user interface 80 is contemplated to be centered on the pane 90, such that the user interface 80 is also centered on the housing 12 of the appliance 10. The engagement between the first and second locating pins 130, 132 and the first and second slots 60, 62 provides for a laterally fixed position for the control panel assembly 40 relative to the housing 12. In this way, the engagement between the first and second locating pins 130, 132 and the first and second slots 60, 62 resist lateral movement in the direction as indicated by arrow 150. Once the control panel assembly 40 is centered on the housing 12 and laterally fixed in the centered position by the engagement between the first and second locating pins 130, 132 and the first and second slots 60, 62, respectively, the control panel assembly 40 can be secured in the desired centered position by fixedly coupling the first and second mounting brackets 70, 72 of the mounting plate 42 to the first and second mounting features 170, 172 of the housing 12. As noted above, the upper and lower mounting apertures 74A, 74B of the first and second mounting brackets 70, 72 are configured to receive fasteners which fixedly couple to the upper mounting apertures 174A and the lower mounting slots 174B of the first and second mounting features 170, 172. In this way, the control panel assembly 40 is retained in the centered position on the housing 12.

With further reference to FIG. 4, the first and second locating pins 130, 132 are shown received within the first and second slots 60, 62, respectively, and are contemplated to be removably received within the first and second slots 60, 62. While two locating pins (first and second locating pins 130, 132) are shown in the embodiment of FIG. 4 along with two slots (first and second slots 60, 62), is contemplated that more slot and pin combinations may be included in the alignment system of the present concept for aligning the control panel assembly 40 on the housing 12. Further, it is contemplated that a single locating pin and slot combination may be provided as a locating feature for the control panel assembly 40.

Figure 5:
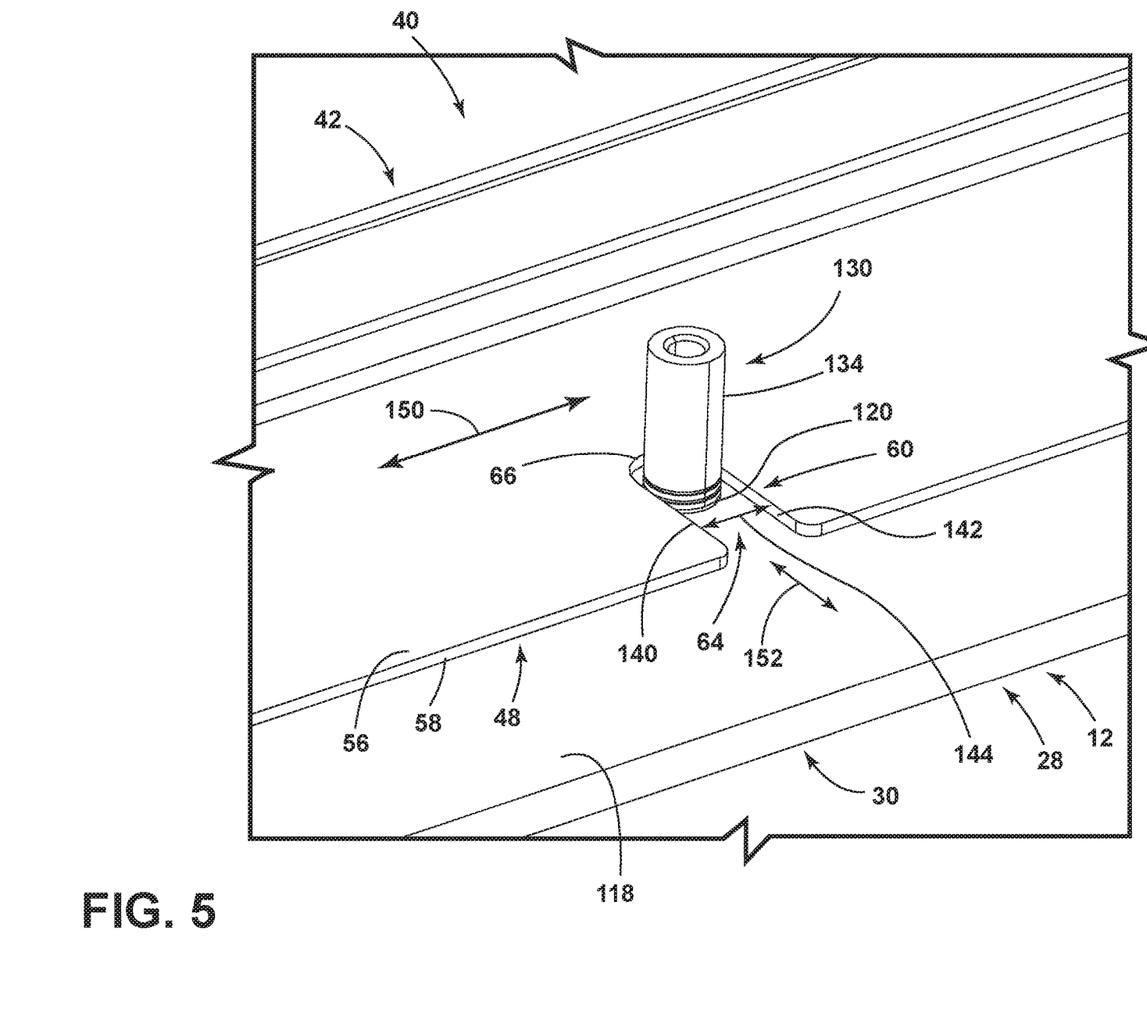
FIG. 5 is a rear top perspective view of the appliance and control panel assembly of FIG. 4 showing a locating pin received in an inwardly opening slot.

Referring now to FIG. 5, the locating pin 130 is shown upwardly extending from the support surface 118 of the support bracket 30 through the mounting aperture 120. Specifically, the locating pin 130 includes a body portion 134 that upwardly extends from the support surface 118 of the support bracket 30. The locating pin 130 shown in FIG. 5, and the other locating pins described herein, may include expanding clinch pin assemblies that can expand to fixedly engage the mounting aperture 120 to provide a fixed coupling between the support bracket 30 and the locating pin 130. Again, as noted above, the locating pin 130 is configured to be slidably, removably and horizontally received within the slot 60 in the direction as indicated by arrow 152. Thus, the body portion 134 of the locating pin 130 is received through the open front portion 64 of the slot 60 in the horizontal manner as indicated by arrow 152 as the locating pin 130 nears the closed end portion 66 of the slot 60. It is not necessary that the locating pin 130 be fully seated in the slot 60 in order to combat lateral movement in the direction as indicated by arrow 150. As further shown in FIG. 5, the slot 60 includes first and second inner edge portions 140, 142 that are spaced-apart a distance 144 which is contemplated to closely received the body portion 134 of the locating pin 130 to resist lateral movement of the control panel assembly 40 once the locating pin 130 is received within the slot 60. However, the control panel assembly 40 can be moved forward and rearward with the locating pin 130 slidably received in the slot 60 to provide alignment between the control panel assembly 40 and other features of the appliance 10. As noted above, reception of the locating pin 130 within the slot 60 of the mounting member 48 of the mounting plate 42 of the control panel assembly 40 correlates to a centered position of the control panel assembly 40 on the housing 12, and may also correlate to a centered position of the user interface 80 as mounted to the control panel assembly 40.

Figure 6:
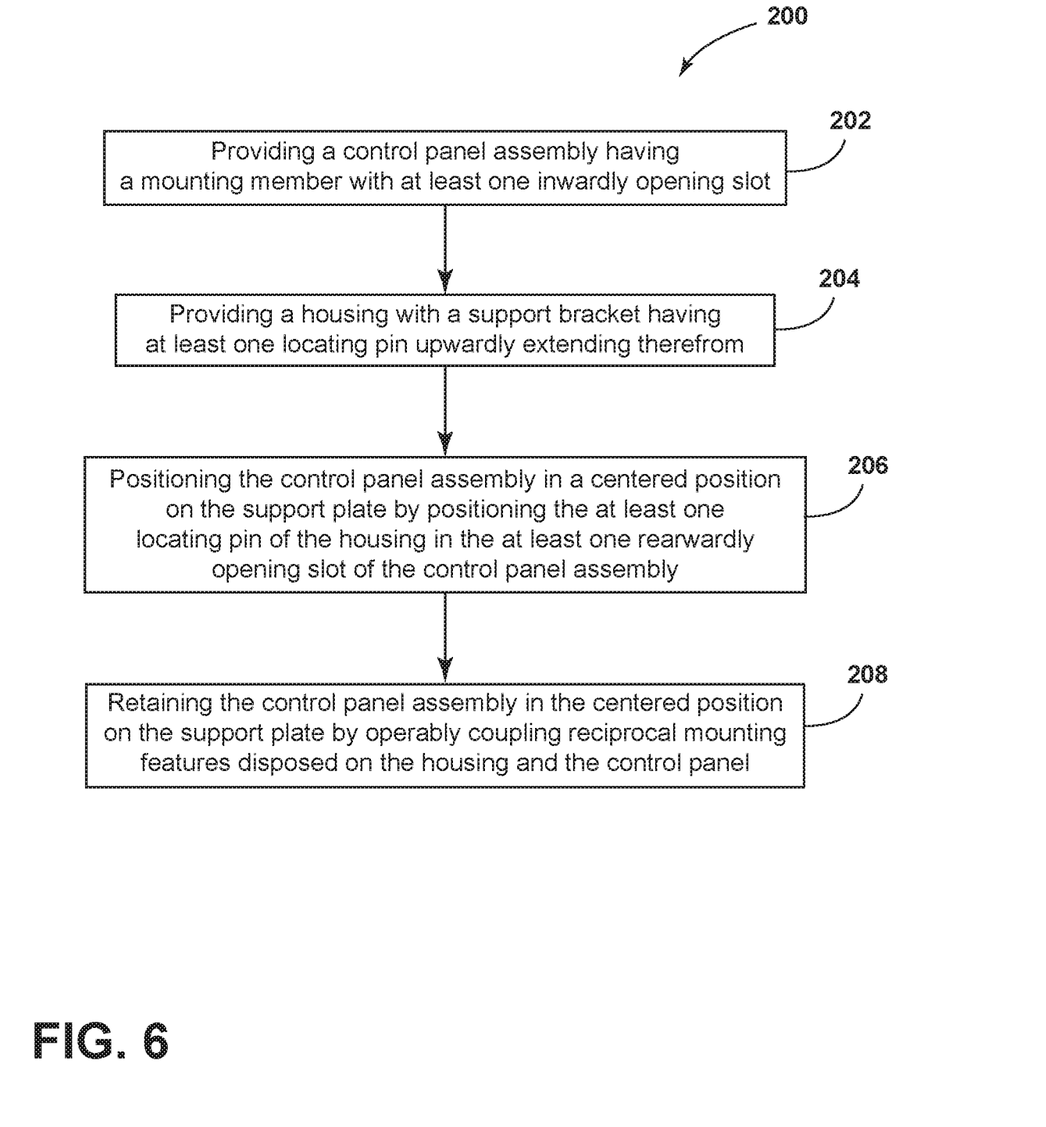
FIG. 6 is a flow chart showing a method of positioning and retaining a control panel assembly on an appliance.

The present concept further includes a method 200 of mounting a control panel assembly to an appliance. The method 200 may comprise the step 202 of providing a control panel assembly having a mounting member with at least one inwardly opening slot. The control panel assembly may include a control panel assembly similar to control panel assembly 40 described above having a mounting member 48 with at least one inwardly opening slot, such as inwardly opening slots 60, 62 described above. The method 200 may further include the step 204 of providing a housing with a support bracket having at least one locating pin upwardly extending therefrom. The housing provided in the method 200 may include a housing similar to housing 12 described above having the support bracket 30 with at least one locating pin 130 extending upwardly therefrom. The method 200 may further include the step 206 of positioning the control panel assembly in a centered position on the support plate by positioning the at least one locating pin of the housing in the at least one rearwardly opening slot of the control panel assembly, as discussed above with reference to FIGS. 3 and 4. The method 200 may further include the step 208 of retaining the control panel assembly in the centered position on the support plate by operably coupling reciprocal mounting features disposed on the housing and the control panel assembly to one another after the control panel assembly is positioned in the centered position. The reciprocal mounting features provided in the method 200 are contemplated to be mounting features such as the first and second mounting brackets 70, 72 which are operably coupled to the first and second mounting features 170, 172.

According to one aspect of the present disclosure, an appliance includes a control panel assembly having a rearwardly extending mounting member. The rearwardly extending mounting member includes a body portion having an outer edge with one or more slots disposed through the body portion and inwardly opening from the outer edge of the body portion. A housing includes a support bracket having a support surface with one or more mounting apertures disposed therethrough. One or more locating pins are received through the one or more mounting apertures. The locating pins include body portions upwardly extending from the support surface of the support bracket. The one or more locating pins are removably received in the one or more slots of the rearwardly extending mounting member of the control panel assembly.

According to another aspect of the present disclosure, the one or more locating pins and the one or more slots are positioned such that the control panel assembly is supported in a centered position on the housing when the one or more locating pins are removably received in the one or more slots.

According to another aspect of the present disclosure, one or more mounting brackets are disposed on the control panel assembly and one or more mounting features are disposed on the housing. The one or more mounting brackets of the control panel assembly are operably coupled to the one or more mounting features of the housing to retain the control panel assembly in the centered position.

According to another aspect of the present disclosure, the one or more mounting brackets include first and second mounting brackets spaced-apart from one another and rearwardly extending from the control panel assembly.

According to another aspect of the present disclosure, the one or more locating pins are horizontally received in the one or more slots.

According to another aspect of the present disclosure, the one or more locating pins include first and second locating pins.

According to another aspect of the present disclosure, the one or more slots include first and second slots in which the first and second locating pins are respectively received.

According to another aspect of the present disclosure, an appliance includes a housing with a frame assembly having a support bracket. The support bracket includes at least one locating pin. A mounting plate includes a front surface with a mounting member outwardly extending from the front surface of the mounting plate. The mounting member includes at least one slot through which the at least one locating pin is slidably received.

According to another aspect of the present disclosure, the appliance includes a user interface mounted on the mounting plate.

According to another aspect of the present disclosure, the at least one locating pin and the at least one slot are respectively positioned on the support bracket and the mounting member, such that the user interface is supported in a centered position on the support bracket when the at least one locating pin is received in the at least one slot.

According to another aspect of the present disclosure, first and second mounting brackets are disposed above the mounting member and outwardly extending from the front surface of the mounting plate.

According to another aspect of the present disclosure, first and second mounting features are disposed on the housing on opposed sides of the support bracket, respectively. The first and second mounting brackets are operably coupled to the first and second mounting features, respectively, to retain the user interface in the centered position.

According to another aspect of the present disclosure, the mounting member includes a body portion having an outer edge. The at least one slot of the mounting member inwardly opens into the body portion from the outer edge of the body portion.

According to another aspect of the present disclosure, the at least one locating pin includes a body portion upwardly extending from an upper surface of the support bracket. The body portion of the at least one locating pin is configured to be horizontally received in the at least one slot.

According to another aspect of the present disclosure, the housing includes a cooking cavity disposed below the support bracket. The mounting plate includes a user interface mounted thereto to define a control panel assembly.

According to yet another aspect of the present disclosure, a method of mounting a control panel assembly to an appliance comprises the steps of: (1) providing a control panel assembly having a mounting member with at least one slot (2) providing a housing with a support bracket having at least one locating pin upwardly extending therefrom (3) positioning the control panel assembly in a centered position on the support plate by positioning the at least one locating pin of the housing in the at least one slot of the control panel assembly (4) retaining the control panel assembly in the centered position on the support plate by operably coupling reciprocal mounting features disposed on the housing and the control panel assembly to one another after the control panel assembly is positioned in the centered position.

According to another aspect of the present disclosure, the step of positioning the at least one locating pin of the housing in the at least one slot further includes, horizontally and slidably receiving the locating pin in the at least one slot.

According to another aspect of the present disclosure, the mounting member includes an outer edge and further wherein the at least one slot opens from the outer edge of the mounting member.

According to another aspect of the present disclosure, the step of operably coupling reciprocal mounting features disposed on the housing and the control panel assembly to one another further includes, fastening first and second mounting brackets of the control panel assembly to first and second mounting features disposed on the housing on opposed sides of the support bracket.

According to another aspect of the present disclosure, the step of positioning the at least one locating pin of the housing in the at least one slot further includes, positioning first and second locating pins of the housing in first and second slots of the mounting member respectively.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

What is claimed is:

1. An appliance, comprising:
   a control panel assembly having a rearwardly extending mounting member, wherein the rearwardly extending mounting member includes a body portion having an outer edge with one or more slots disposed through the body portion and inwardly opening from the outer edge of the body portion;
   a housing having a support bracket, wherein the support bracket includes a support surface with one or more mounting apertures disposed therethrough; and
   one or more locating pins received through the one or more mounting apertures, wherein the one or more locating pins include body portions upwardly extending from the support surface of the support bracket, and further wherein the one or more locating pins are removably received in the one or more slots of the rearwardly extending mounting member.

2. The appliance of claim 1, wherein the one or more locating pins and the one or more slots are positioned such that the control panel assembly is supported in a centered position on the housing when the one or more locating pins are removably received in the one or more slots.

3. The appliance of claim 2, including:
   one or more mounting brackets disposed on the control panel assembly; and
   one or more mounting features disposed on the housing, wherein the one or more mounting brackets of the control panel assembly are operably coupled to the one or more mounting features of the housing to retain the control panel assembly in the centered position.

4. The appliance of claim 3, wherein the one or more mounting brackets include first and second mounting brackets spaced-apart from one another and rearwardly extending from the control panel assembly.

5. The appliance of claim 1, wherein the one or more locating pins are horizontally received in the one or more slots.

6. The appliance of claim 1, wherein the one or more locating pins include first and second locating pins.

7. The appliance of claim 6, wherein the one or more slots include first and second slots in which the first and second locating pins are respectively received.

8. An appliance, comprising:
   a housing having a frame assembly with a support bracket, wherein the support bracket includes at least one locating pin; and a mounting plate having a front surface with a mounting member outwardly extending from the front surface of the mounting plate, wherein the mounting member includes at least one slot through which the at least one locating pin is slidably received, wherein the mounting member includes a body portion having an outer edge, and further wherein the at least one slot inwardly opens into the body portion from the outer edge of the body portion.

9. The appliance of claim 8, including:
a user interface mounted on the mounting plate.

10. The appliance of claim 9, wherein the at least one locating pin and the at least one slot are respectively positioned on the support bracket and the mounting member, such that the user interface is supported in a centered position on the support bracket when the at least one locating pin is received in the at least one slot.

11. The appliance of claim 10, including:
first and second mounting brackets disposed above the mounting member and outwardly extending from the front surface of the mounting plate.

12. The appliance of claim 11, including:
first and second mounting features disposed on the housing on opposed sides of the support bracket, respectively, wherein the first and second mounting brackets are operably coupled to the first and second mounting features, respectively, to retain the user interface in the centered position.

13. The appliance of claim 8, wherein the at least one locating pin includes a body portion upwardly extending from an upper surface of the support bracket, and further wherein the body portion is configured to be horizontally received in the at least one slot.

14. The appliance of claim 8, wherein the housing includes a cooking cavity disposed below the support bracket, and further wherein the mounting plate includes a user interface mounted thereto to define a control panel assembly.

15. A method of mounting a control panel assembly to an appliance, the method comprising the steps of:
providing a control panel assembly having a mounting member with at least one slot;
providing a housing with a support bracket having at least one locating pin upwardly extending therefrom;
positioning the control panel assembly in a centered position on the support plate by positioning the at least one locating pin of the housing in the at least one slot of the control panel assembly; and
retaining the control panel assembly in the centered position on the support plate by operably coupling reciprocal mounting features disposed on the housing and the control panel assembly to one another after the control panel assembly is positioned in the centered position.

16. The method of claim 15, wherein the step of positioning the at least one locating pin of the housing in the at least one slot further includes, horizontally and slidably receiving the locating pin in the at least one slot.

17. The method of claim 15, wherein the mounting member includes an outer edge and further wherein the at least one slot opens from the outer edge of the mounting member.

18. The method of claim 15, wherein the step of operably coupling reciprocal mounting features disposed on the housing and the control panel assembly to one another further includes, fastening first and second mounting brackets of the control panel assembly to first and second mounting features disposed on the housing on opposed sides of the support bracket.

19. The method of claim 15, wherein the step of positioning the at least one locating pin of the housing in the at least one slot further includes, positioning first and second locating pins of the housing in first and second slots of the mounting member respectively.

\* \* \* \* \*